United States Patent
Mao et al.

(10) Patent No.: US 12,207,052 B2
(45) Date of Patent: Jan. 21, 2025

(54) MEMS STRUCTURE

(71) Applicant: Fortemedia, Inc., Santa Clara, CA (US)

(72) Inventors: Chun-Kai Mao, Tainan (TW); Chih-Yuan Chen, Tainan (TW); Feng-Chia Hsu, Tainan (TW); Jien-Ming Chen, Tainan (TW); Wen-Shan Lin, Tainan (TW); Nai-Hao Kuo, Tainan (TW)

(73) Assignee: FORTEMEDIA, INC., Alviso, CA (US)

( * ) Notice: Subject to any disclaimer, the term of this patent is extended or adjusted under 35 U.S.C. 154(b) by 253 days.

(21) Appl. No.: 17/937,477

(22) Filed: Oct. 3, 2022

(65) Prior Publication Data
US 2023/0319486 A1     Oct. 5, 2023

Related U.S. Application Data (60) Provisional application No. 63/325,750, filed on Mar. 31, 2022.

(51) Int. Cl.
| | |
|---|---|
| *H04R 19/04* | (2006.01) |
| *B81B 3/00* | (2006.01) |
| *H04R 7/04* | (2006.01) |
| *H04R 7/18* | (2006.01) |

(52) U.S. Cl.
CPC ........... *H04R 19/04* (2013.01); *B81B 3/0072* (2013.01); *H04R 7/04* (2013.01); *H04R 7/18* (2013.01); *B81B 2201/0257* (2013.01); *B81B 2203/0127* (2013.01); *H04R 2201/003* (2013.01)

(58) Field of Classification Search
CPC . H04R 19/04; H04R 7/04; H04R 7/18; H04R 2201/003; B81B 3/0072; B81B 2201/0257; B81B 2203/0127
See application file for complete search history.

(56) References Cited

U.S. PATENT DOCUMENTS 10,343,898 B1 * 7/2019 Chen ...................... H04R 7/08

* cited by examiner

*Primary Examiner* — Sunita Joshi
(74) *Attorney, Agent, or Firm* — McClure, Qualey & Rodack, LLP (57) ABSTRACT

A MEMS structure is provided. The MEMS structure includes a substrate having an opening portion and a backplate disposed on one side of the substrate. The MEMS structure also includes a diaphragm disposed between the substrate and the backplate. The opening portion of the substrate is under the diaphragm, and an air gap is formed between the diaphragm and the backplate. The MEMS structure further includes a pillar structure connected with the backplate and the diaphragm and a protection post structure extending from the backplate into the air gap. From a top view of the backplate, the protection post structure surrounds the pillar structure.

12 Claims, 5 Drawing Sheets

MEMS STRUCTURE

CROSS REFERENCE TO RELATED APPLICATIONS

This application claims the benefit of U.S. Provisional Application No. 63/325,750, filed on Mar. 31, 2022, the entirety of which is incorporated by reference herein.

BACKGROUND

Technical Field

Embodiments of the present disclosure relate in general to an acoustic transducer, and in particular they relate to a micro-electro-mechanical system (MEMS) structure that may be used in a micro-electro-mechanical system microphone.

Description of the Related Art

The current trend in personal electronics is toward fabricating slim, compact, lightweight and high-performance electronic devices, including microphones. A microphone is used to receive sound waves and convert acoustic signals into electrical signals. Microphones are widely used in daily life and are installed in such electronic products as telephones, mobiles phones, and recording pens. In a capacitive microphone, variations in acoustic pressure (i.e., local pressure deviation from the ambient atmospheric pressure caused by sound waves) force the diaphragm to deform correspondingly, and the deformation of the diaphragm changes the air gap, which induces a capacitance variation. The variation of acoustic pressure of the sound waves can thus be obtained by detecting the voltage difference caused by the capacitance variation.

This is distinct from conventional electret condenser microphones (ECM), in which mechanical and electronic elements of micro-electro-mechanical system (MEMS) microphones can be integrated on a semiconductor material using integrated circuit (IC) technology to fabricate a miniature microphone. MEMS microphones have such advantages as a compact size, being lightweight, and having low power consumption, and they have therefore entered the mainstream of miniaturized microphones.

Although existing MEMS microphones have generally been adequate for their intended purposes, they have not been entirely satisfactory in all respects. For example, the diaphragm of the MEMS microphone vibrates when acoustic pressure is applied, and it is deformed. During the air pressure, the diaphragm will suffer large deformation, which will cause crack in the sensor of the MEMS microphone.

SUMMARY

The micro-electro-mechanical system (MEMS) structure in the present disclosure may be used in a micro-electro-mechanical system microphone, which includes a protection post structure extending from the backplate into the air gap. In some embodiments, the protection post structure may reduce the stress concentration around the pillar structure caused by the deformation of the diaphragm, thereby preventing the diaphragm from being damaged under the air pressure.

Some embodiments of the present disclosure include a MEMS structure. The MEMS structure includes a substrate having an opening portion and a backplate disposed on one side of the substrate. The MEMS structure also includes a diaphragm disposed between the substrate and the backplate. The opening portion of the substrate is under the diaphragm, and an air gap is formed between the diaphragm and the backplate. The MEMS structure further includes a pillar structure connected with the backplate and the diaphragm and a protection post structure extending from the backplate into the air gap. From a top view of the backplate, the protection post structure surrounds the pillar structure.

In some embodiments, the protection post structure is separated from the diaphragm.

In some embodiments, from the top view of the backplate, the protection post structure is formed as a complete or non-complete closed pattern.

In some embodiments, from the top view of the backplate, the protection post structure is divided into a plurality of protection post segments.

In some embodiments, the backplate has acoustic holes, and from the top view of the backplate, at least one of the acoustic holes is disposed between the pillar structure and the protection post structure.

In some embodiments, the MEMS structure further includes a support post structure extending from the backplate into the air gap. From the top view of the backplate, the support post structure is disposed outside the protection post structure with respect to the pillar structure.

In some embodiments, the MEMS structure further includes a plurality of dimples extending from the backplate into the air gap. The distance between the dimples and the diaphragm is greater than the distance between the protection post structure and the diaphragm.

In some embodiments, the backplate comprises a conductive layer and an insulating layer covering the conductive layer.

In some embodiments, the conductive layer is a conductive segment or divided into a plurality of conductive segments, and the conductive segments are disconnected with each other from a cross-sectional view of the backplate.

In some embodiments, the diaphragm comprises ventilation holes.

In some embodiments, the pillar structure corresponds to a center of the backplate and a center of the diaphragm.

In some embodiments, the protection post structure comprises a conductive material or an insulating material.

In some embodiments, the protection post structure is a floating conductor or equipotential with the diaphragm.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 1A:
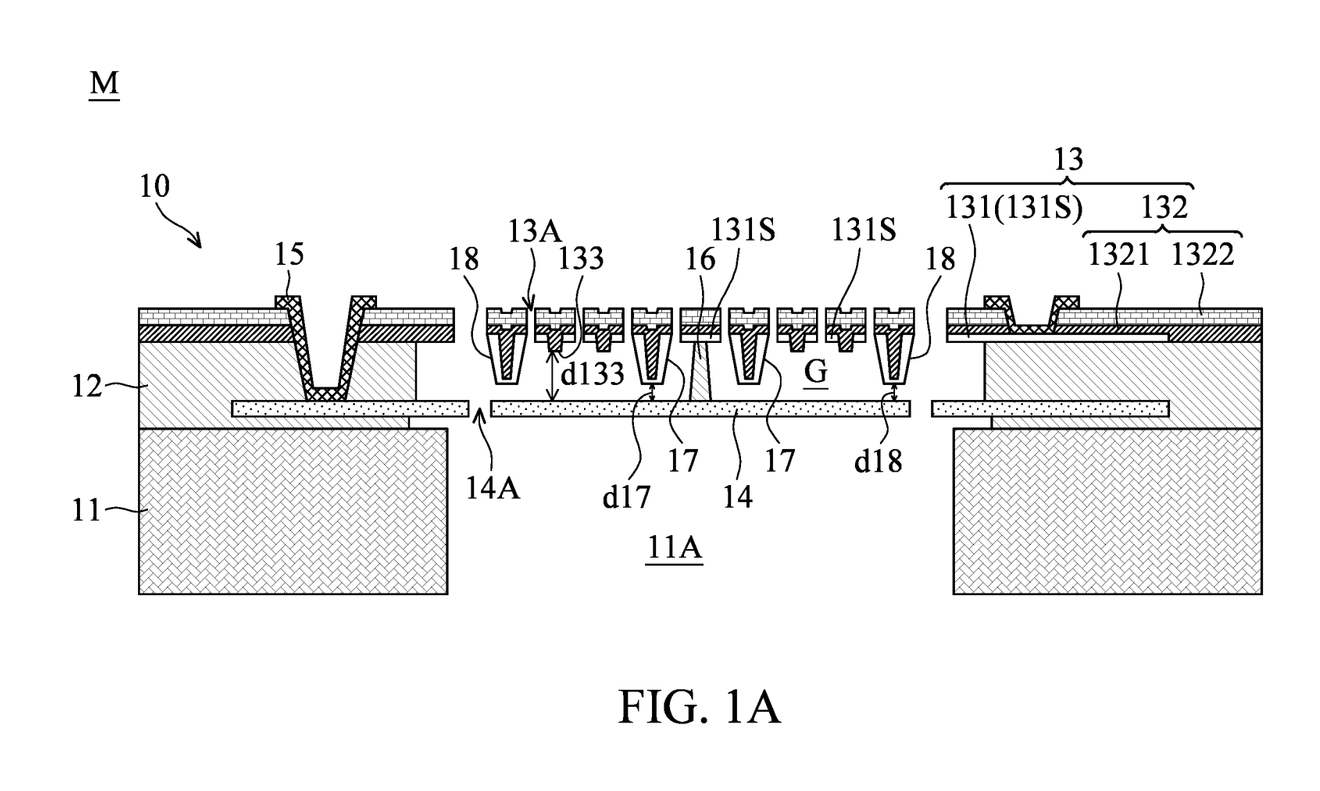
FIG. 1A and FIG. 1B are partial cross-sectional views illustrating a micro-electro-mechanical system (MEMS) microphone according to some embodiments of the present disclosure.
Figure 1B:
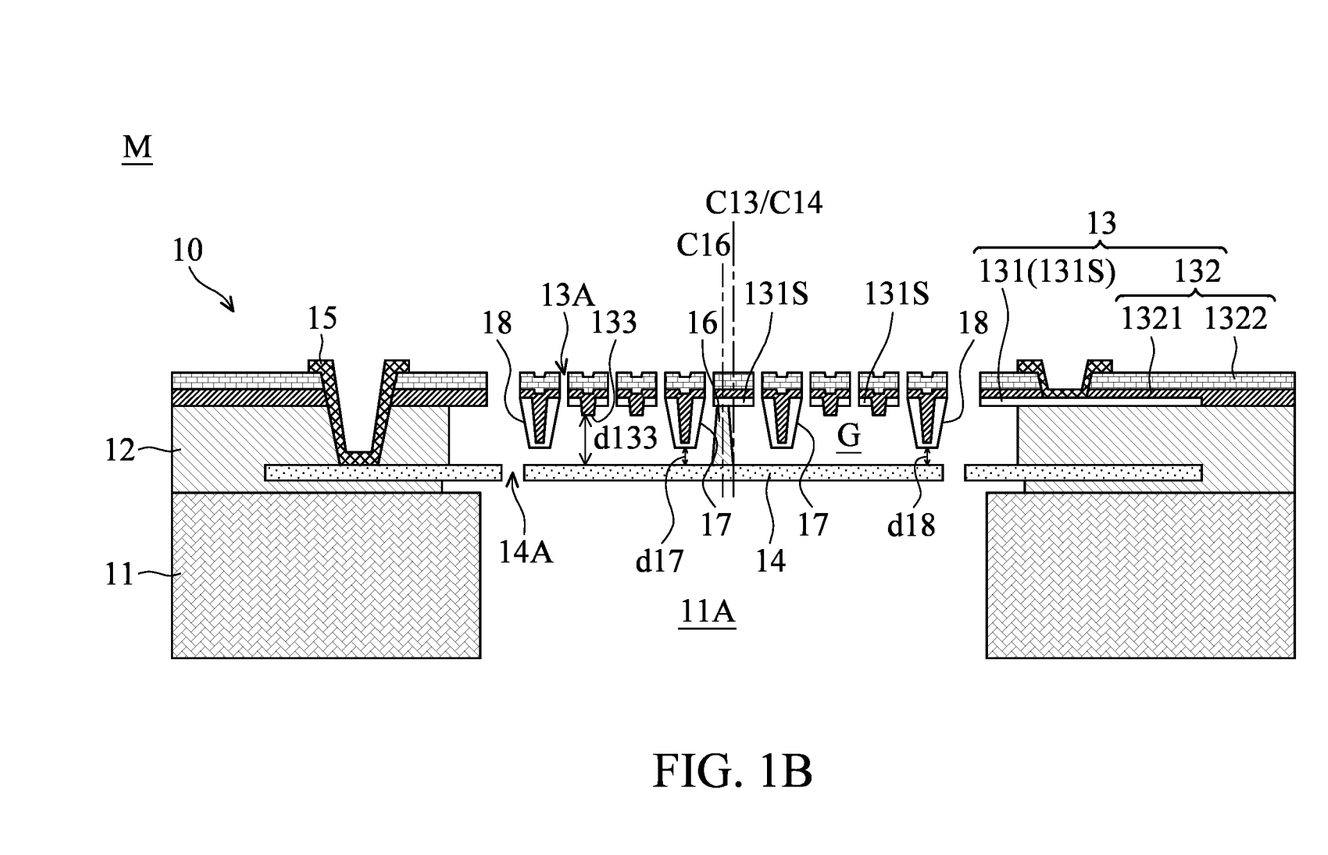

FIG. 1A and FIG. 1B are partial cross-sectional views illustrating a micro-electro-mechanical system (MEMS) microphone M according to some embodiments of the present disclosure. For example, the MEMS microphone M may be a capacitive microphone. As shown in FIG. 1A and FIG. 1B, the MEMS microphone M includes a MEMS structure 10. In some embodiments, the MEMS structure 10 includes a substrate 11, a dielectric layer 12, a backplate 13, a diaphragm 14, and an electrode layer 15. It should be noted that some components of the MEMS microphone M (MEMS structure 10) have been omitted in FIG. 1A and FIG. 1B for sake of brevity.

The substrate 11 is configured to support the dielectric layer 12, the backplate 13, the diaphragm 14, and the electrode layer 15 on one side of the substrate 11. As shown in FIG. 1A and FIG. 1B, in some embodiments, the substrate 11 has an opening portion 11A. The opening portion 11A allows sound waves received by the MEMS microphone M to pass through and/or enter the MEMS structure 10. For example, the substrate 11 may include silicon or the like, but the present disclosure is not limited thereto.

The dielectric layer 12 is disposed between the substrate 11 and the diaphragm 14, and between the diaphragm 14 and the backplate 13. In other words, the diaphragm 14 is inserted in the dielectric layer 12, so as to provide partial isolation between the substrate 11, the diaphragm 14 and, the backplate 13 from each other. Moreover, the dielectric layer 12 is disposed around the backplate 13 and the diaphragm 14, such that the backplate 13 and the diaphragm 14 are supported at their edges by the dielectric layer 12. The dielectric layer 12 may be made of silicon oxide or the like.

The backplate 13 is disposed on one side of the substrate 11. The backplate 13 may have sufficient stiffness, such that it would not be bending or movable when the sound waves pass through the backplate 13. For example, the backplate 13 may be a stiff perforated element, but the present disclosure is not limited thereto. As shown in FIG. 1, in some embodiments, the backplate 13 includes a number of acoustic holes 13A, and each acoustic hole 13A passes through the backplate 13. The acoustic holes 13A are configured to allow the sound waves to pass through.

As shown in FIG. 1A and FIG. 1B, in some embodiments, the backplate 13 includes a conductive layer 131 and an insulating layer 132 covering the conductive layer 131 for protection. The insulating layer 132 may further include a first insulating layer 1321 and a second insulating layer 1322. As shown in FIG. 1A and FIG. 1B, the conductive layer 131 may be disposed on the dielectric layer 12, the first insulating layer 1321 may be disposed on the conductive layer 131, and the second insulating layer 1322 may be disposed on the first insulating layer 1321. For example, the conductive layer 131 may include poly-silicon or the like, and the insulating layer 132 (e.g., the first insulating layer 1321 or the second insulating layer 1322) may include silicon nitride or the like, but the present disclosure is not limited thereto. Moreover, the first insulating layer 1321 and the second insulating layer 1322 may include the same material or different materials.

As shown in FIG. 1A and FIG. 1B, in some embodiments, the conductive layer 131 is divided into a plurality of conductive segments 131S, and the conductive segments 131S are disconnected with each other from a cross-sectional view of the backplate 13, but the present disclosure is not limited thereto. In some other embodiments, the conductive layer 131 is a (complete) conductive segment.

The MEMS structure 10 may be electrically connected to a circuit (not shown) via several electrode pads of the electrode layer 15 that is disposed on the backplate 13 and electrically connected to the conductive layer 131 and the diaphragm 14. For example, the electrode layer 15 may include copper, silver, gold, aluminum, the like, alloy thereof, or a combination thereof.

The diaphragm 14 is disposed between the substrate 11 and the backplate 13, and the opening portion 11A of the substrate 11 is under the diaphragm 14. The diaphragm 14 is movable or displaceable relative to the backplate 13. The diaphragm 14 is configured to sense the sound waves received by the MEMS microphone M. As shown in FIG. 1A and FIG. 1B, in some embodiments, the diaphragm 14 includes ventilation holes 14A, and an air gap G is formed between the diaphragm 14 and the backplate 13. The sound waves pass through the diaphragm 14 via ventilation holes 14A to reach the air gap G, and then pass through the backplate 13 via acoustic hole 13A.

In more detail, the displacement change of the diaphragm 14 relative to the backplate 13 causes a capacitance change between the diaphragm 14 and the backplate 13. The capacitance change is then converted into an electric signal by circuitry connected with the diaphragm 14 and the backplate 13, and the electrical signal is sent out of the MEMS microphone M through the electrode layer 15.

On the other hand, in order to increase the sensitivity of the diaphragm 14, a number of ventilation holes 14A may be provided in the diaphragm 14 to reduce the stiffness of the diaphragm 14. In some embodiments, there may be more than two ventilation holes 14A. With this structural feature, high sensitivity of the MEMS microphone M can be achieved. In addition, the ventilation holes 14A in the diaphragm 14 are also configured to relieve the high air pressure on the diaphragm 14.

In some embodiments, the MEMS structure 10 includes a pillar structure 16 connected with the backplate 13 and the diaphragm 14. In more detail, the pillar structure 16 may be in direct contact with the backplate 13 (e.g., the conductive layer 131) and the diaphragm 14. For example, the pillar structure 16 may include insulating material, such as silicon oxide or the like, but the present disclosure is not limited thereto.

As shown in FIG. 1A, in some embodiments, the pillar structure 16 corresponds to the center of the backplate 13 and the center of the diaphragm 14. That is, the pillar structure 16 may be connected to the center of the backplate 13 and the center of the diaphragm 14, but the present disclosure is not limited thereto.

As shown in FIG. 1B, in some other embodiments, the pillar structure 16 is offset from the center of the backplate 13 and the center of the diaphragm 14. In more detail, the central axis C16 of the pillar structure 16 and the central axis C13 of the backplate 13 may be separated from each other. Similarly, the central axis C16 of the pillar structure 16 and the central axis C14 of the diaphragm 14 may be separated from each other.

In some embodiments, the pillar structure 16 is a hollow structure. That is, there is a space inside the pillar structure 16, but the present disclosure is not limited thereto. In some other embodiments, the pillar structure 16 is a solid structure. The pillar structure 16 may reduce the stress concentration of the diaphragm 14 and protect the diaphragm from damage.

In some embodiments, the MEMS structure 10 further includes a protection post structure 17 extending from the backplate 13 into the air gap G. As shown in FIG. 1A and FIG. 1B, in some embodiments, the protection post structure 17 is separated from the diaphragm 14. In some embodiments, the protection post structure 17 includes a conductive material (e.g., semiconductor material such as silicon (Si) or germanium (Ge)) or an insulating material (e.g., silicon nitride).

For example, as shown in FIG. 1A and FIG. 1B, the protection post structure 17 may include silicon nitride portion in the center and silicon layer that surrounds the silicon nitride portion, but the present disclosure is not limited thereto. In other examples, the protection post structure 17 may be the entire insulating pillar or the entire conductive pillar, which may be adjusted according to actual needs.

In some embodiments, the MEMS structure 10 further includes a support post structure 18 extending from the backplate 13 into the air gap G. As shown in FIG. 1A and FIG. 1B, in some embodiments, the support post structure 18 is separated from the diaphragm 14. The support post structure 18 may include the same material or similar material to the protection post structure 17.

Similarly, as shown in FIG. 1A and FIG. 1B, the support post structure 18 may include silicon nitride portion in the center and silicon layer that surrounds the silicon nitride portion, but the present disclosure is not limited thereto. In other examples, the support post structure 18 may be the entire insulating pillar or the entire conductive pillar, which may be adjusted according to actual needs.

In some embodiments, the MEMS structure 10 further includes a plurality of dimples 133 extending from the backplate 13 into the air gap G. As shown in FIG. 1A and FIG. 1B, in some embodiments, the distance d133 between the dimples 133 and the diaphragm 14 is greater than the distance d17 between the protection post structure 17 and the diaphragm 14. Similarly, the distance d133 between the dimples 133 and the diaphragm 14 is greater than the distance d18 between the support post structure 18 and the diaphragm 14. In other words, the dimples 133 are farther from the diaphragm 14 than the protection post structure 17 or the support post structure 18.

In some embodiments, at least one dimple 133 is disposed between the protection post structure 17 and the support post structure 18. In the embodiment shown in FIG. 1A and FIG. 1B, all dimples 133 are disposed between the protection post structure 17 and the support post structure 18, but the present disclosure is not limited thereto.

Figure 1C:
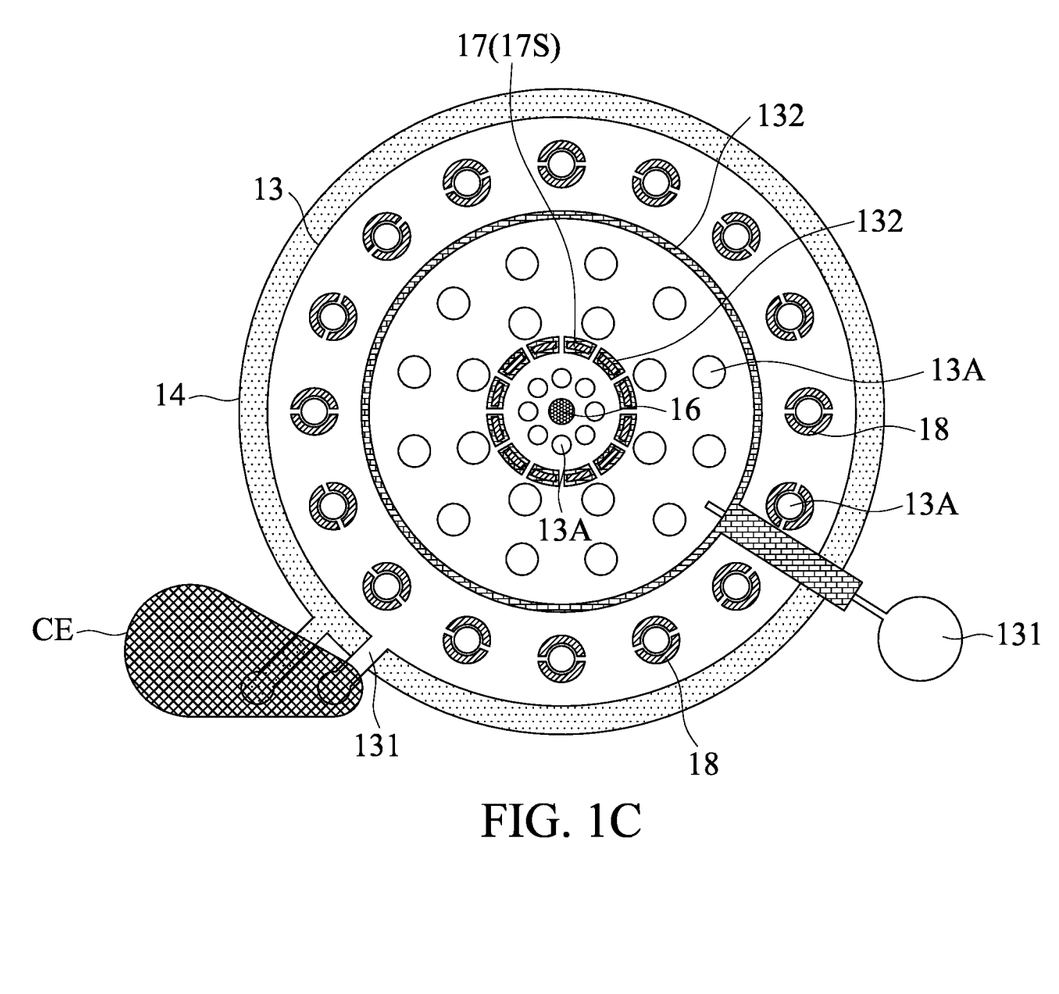
FIG. 1C is a partial top view illustrating the backplate and the diaphragm according to some embodiments of the present disclosure.

FIG. 1C is a partial top view illustrating the backplate 13 and the diaphragm 14 according to some embodiments of the present disclosure, which may show the relationship between the acoustic holes 13A, the pillar structure 16, the protection post structure 17, and the support post structure 18. It should be noted that FIG. 1C may not correspond exactly to FIG. 1A, and some components have been omitted in FIG. 1C for sake of brevity.

Referring to FIG. 1C, in some embodiments, from a top view of the backplate 13, the protection post structure 17 surrounds the pillar structure 16. As shown in FIG. 1C, in some embodiments, the protection post structure 17 is divided into a plurality of protection post segments 17S, and the protection post segments 17S are separated from each other, but the present disclosure is not limited thereto.

As shown in FIG. 1C, in some embodiments, from the top view of the backplate 13, at least one acoustic hole 13A is disposed between the pillar structure 16 and the protection post structure 17, and at least one acoustic hole 13A is disposed between the protection post structure 17 and the support post structure 18.

As shown in FIG. 1C, in some embodiments, from the top view of the backplate 13, the support post structure 18 is disposed outside the protection post structure 17 with respect to the pillar structure 16, and the support post structure 18 surrounds the acoustic hole 13A.

In some embodiments, the protection post structure 17 and the support post structure 18 are floating conductors or equipotential with the diaphragm 14. In other words, when the protection post structure 17 and the support post structure 18 are entire conductive pillars, the conductive pillars are floating conductors or have the same potential as the diaphragm 14.

For example, as shown in FIG. 1C, the backplate 13 (conductive layer 131) and the diaphragm 14 may be electrically connected to the common electrode CE. When the protection post structure 17 and the support post structure 18 are entire conductive pillars, since the protection post structure 17 and the support post structure 18 are electrically connected to the conductive layer 131 of the backplate 13, so that they may have the same potential as the diaphragm 14.

Figure 2:
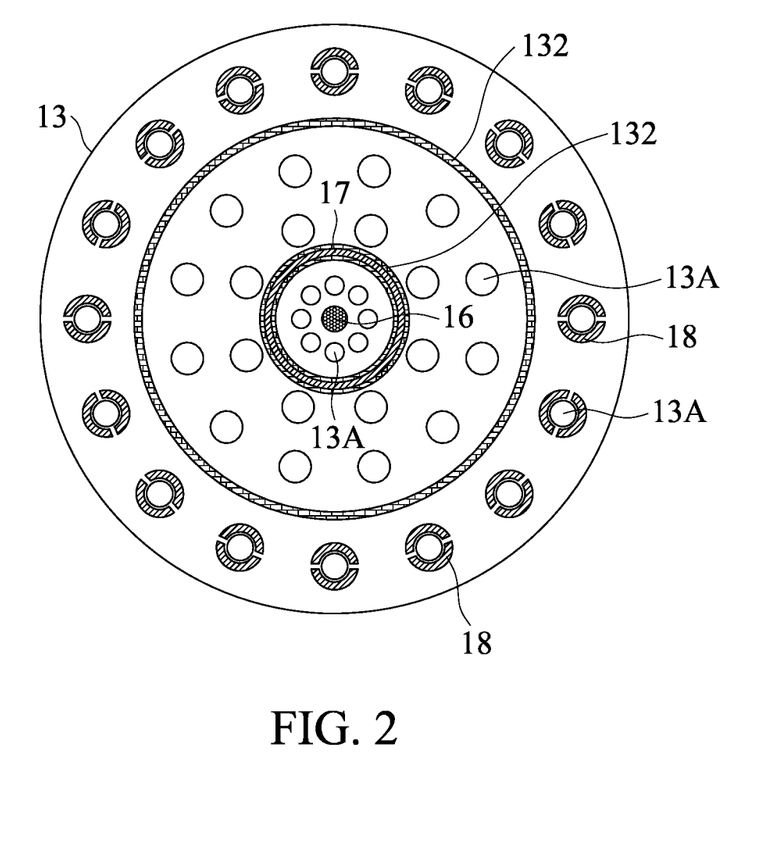
FIG. 2 and FIG. 3 are partial top views illustrating the backplate according to some other embodiments of the present disclosure
Figure 3:
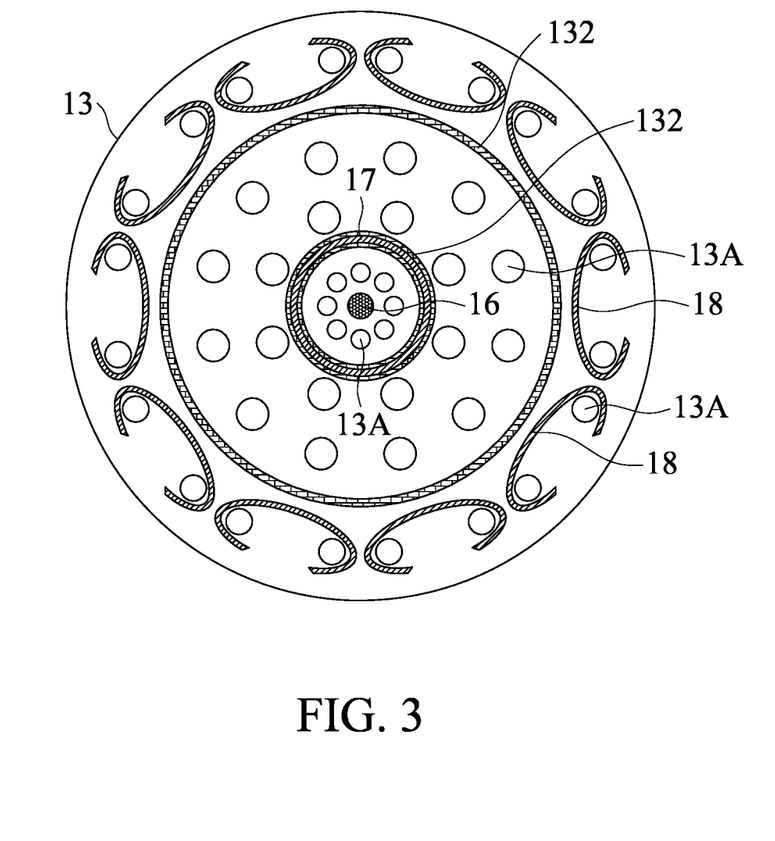

FIG. 2 and FIG. 3 are partial top views illustrating the backplate 13 according to some other embodiments of the present disclosure, which may show the relationship between the acoustic holes 13A, the pillar structure 16, the protection post structure 17, and the support post structure 18. It should be noted that FIG. 2 and FIG. 3 may not correspond exactly to FIG. 1A, and some components have been omitted in FIG. 2 and FIG. 3 for sake of brevity.

Referring to FIG. 2, in some embodiments, from the top view of the backplate 13, the protection post structure 17 surrounds the pillar structure 16. As shown in FIG. 2, in some embodiments, the protection post structure 17 is formed as a complete closed pattern. For example, as shown in FIG. 2, the protection post structure 17 may be formed as a closed circle, but the present disclosure is not limited thereto.

In some other embodiments, the protection post structure 17 is formed as a non-complete closed pattern. Referring to FIG. 3, in some embodiments, from the top view of the backplate 13, the support post structure 18 is formed as a C-shaped pattern. As shown in FIG. 3, in some embodiments, each support post structure 18 partially surrounds (at least) two acoustic holes 13A, but the present disclosure is not limited thereto.

As noted above, in the embodiments of the present disclosure, since the MEMS structure includes a protection post structure (and a support post structure in some embodiments) that extends from the backplate into the air gap, the stress concentration around the pillar structure may be effectively reduced (a simulation test shows more than 40% stress relief), thereby preventing the diaphragm from being damaged under the air pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro-electro-mechanical system structure, comprising:
   a substrate having an opening portion;
   a backplate disposed on one side of the substrate;
   a diaphragm disposed between the substrate and the backplate, wherein the opening portion of the substrate is under the diaphragm, and an air gap is formed between the diaphragm and the backplate;
   a pillar structure connected with the backplate and the diaphragm; and
   a protection post structure and a plurality of dimples extending from the backplate into the air gap,
   wherein from a top view of the backplate, the protection post structure surrounds the pillar structure, and a distance between the dimples and the diaphragm is greater than a distance between the protection post structure and the diaphragm.

2. The micro-electro-mechanical system structure as claimed in claim 1, wherein the protection post structure is separated from the diaphragm.

3. The micro-electro-mechanical system structure as claimed in claim 1, wherein from the top view of the backplate, the protection post structure is formed as a complete or non-complete closed pattern.

4. The micro-electro-mechanical system structure as claimed in claim 1, wherein from the top view of the backplate, the protection post structure is divided into a plurality of protection post segments.

5. The micro-electro-mechanical system structure as claimed in claim 1, wherein the backplate has acoustic holes, and from the top view of the backplate, at least one of the acoustic holes is disposed between the pillar structure and the protection post structure.

6. The micro-electro-mechanical system structure as claimed in claim 1, further comprising:
   a support post structure extending from the backplate into the air gap, wherein from the top view of the backplate, the support post structure is disposed outside the protection post structure with respect to the pillar structure.

7. The micro-electro-mechanical system structure as claimed in claim 1, wherein the backplate comprises a conductive layer and an insulating layer covering the conductive layer.

8. The micro-electro-mechanical system structure as claimed in claim 7, wherein the conductive layer is a conductive segment or divided into a plurality of conductive segments, and the conductive segments are disconnected with each other from a cross-sectional view of the backplate.

9. The micro-electro-mechanical system structure as claimed in claim 1, wherein the diaphragm comprises ventilation holes.

10. The micro-electro-mechanical system structure as claimed in claim 1, wherein the pillar structure corresponds to a center of the backplate and a center of the diaphragm.

11. The micro-electro-mechanical system structure as claimed in claim 1, wherein the protection post structure comprises a conductive material or an insulating material.

12. The micro-electro-mechanical system structure as claimed in claim 1, wherein the protection post structure is a floating conductor or equipotential with the diaphragm.

\* \* \* \* \*